(12) United States Patent
Muhlbacher et al.

(10) Patent No.: US 7,342,448 B2
(45) Date of Patent: Mar. 11, 2008

(54) POWER OUTPUT STAGE

(75) Inventors: Benno Muhlbacher, Bad St. Leonhard (AT); Joachim Gratz, Dresden (DE); Evelyne Kricki, Villach (AT); Thomas Pötscher, Dresden (DE); Mayk Roehrich, Dresden (DE); David San Segundo Bello, Villach (AT); Andreas Weisbauer, Portschach (AT)

(73) Assignee: Infineon Technologies AG, Munich (DE)

( * ) Notice: Subject to any disclaimer, the term of this patent is extended or adjusted under 35 U.S.C. 154(b) by 48 days.

(21) Appl. No.: 11/477,576

(22) Filed: Jun. 29, 2006

(65) Prior Publication Data

US 2007/0001735 A1    Jan. 4, 2007

(30) Foreign Application Priority Data

Jun. 30, 2005    (DE)    ........................ 10 2005 030 565

(51) Int. Cl.
*H03F 3/217*    (2006.01)

(52) U.S. Cl. ........................ 330/251; 330/269; 327/375

(58) Field of Classification Search ................ 330/251, 330/269; 327/375
See application file for complete search history.

(56) References Cited

U.S. PATENT DOCUMENTS

| | | | | |
|---|---|---|---|---|
| 3,899,689 A | * | 8/1975 | Baker | .......................... 307/117 |
| 4,818,893 A | * | 4/1989 | Domnitz | ...................... 327/375 |
| 6,867,621 B2 | * | 3/2005 | Mulder et al. | ................. 327/65 |
| 7,135,927 B2 | * | 11/2006 | Parkhurst | .................... 330/255 |
| 7,279,931 B2 | * | 10/2007 | Lee et al. | ...................... 326/81 |
| 2004/0027755 A1 | | 2/2004 | Hajimiri et al. | |
| 2004/0184627 A1 | | 9/2004 | Kost et al. | |
| 2007/0057831 A1 | * | 3/2007 | Yamaoka | ..................... 341/144 |

FOREIGN PATENT DOCUMENTS

DE    19824768    12/1999

OTHER PUBLICATIONS

German Office Action dated Feb. 9, 2006.

* cited by examiner

*Primary Examiner*—Patricia Nguyen
(74) *Attorney, Agent, or Firm*—Jenkins, Wilson, Taylor & Hunt, P.A.

(57) ABSTRACT

A class D power output stage for switching a supply voltage comprises a limiting transistor with a controllable path and a control terminal, a complementary limiting transistor with a controllable path and a control terminal, a switching transistor with a controllable path and a control terminal, and a complementary switching transistor with a controllable path and a control terminal. A switched output signal between the controllable paths of the limiting and complementary limiting transistors can be taped off, the controllable paths of the limiting and the complementary limiting transistors are connected together and are connected to a first and a second supply terminal via the controllable paths of the switching and complementary switching transistors, and the switching and the complementary switching transistors have a lower electrical strength than the limiting and complementary limiting transistors. The output stage further comprises a level matching device for generating control signals in response to an input switching signal. The matching device is connected to the supply voltage and the control signals are fed to the control terminals.

18 Claims, 4 Drawing Sheets

POWER OUTPUT STAGE

BACKGROUND OF THE INVENTION

The present invention relates to a power output stage.

In power output stages in xDSL applications, powers of up to 100 mW frequently have to be transmitted from a switching centre to subscriber modems via conventional copper wire lines. The signal connection should take place with lower power dissipation and high linearity. At the same time, a corresponding output stage is arranged with other components in a very small space on a circuit board. To achieve the highest possible packing density, for example, a standard CMOS process is used which allows a maximum supply voltage of around 18V. The relatively high supply voltage is necessary for being able to transmit multi-tone signals with a high crest factor via the copper wire lines.

For example, D-type power stages are known which amplify relatively efficiently. To provide a general explanation of the problems involved, a corresponding class D power stage is shown in FIG. 1. Essentially, two transistors M1, M2 are driven as switches. The load paths or the controllable paths, respectively, of the transistors M1, M2 are connected between a supply voltage VDD–VSS. The corresponding gate terminals are in each case supplied with an input switching signal SIN, SINQ. The complementary switching signal SINQ is generated by an inverter I. At a node K between the controllable paths of the transistors M1, M2, an output signal OUT can be picked up which has a signal swing which corresponds to the supply voltage VDD–VSS. Furthermore, a diode D1, D2 are in each case provided which are connected in parallel with the controllable paths of the transistors M1, M2.

As a rule, the input switching signal SIN has a signal swing which corresponds to logic levels, for example of 2.5 V, whereas the supply voltage VDD–VSS can be about 20 V. The transistors M1, M2 must, therefore, exhibit particularly high electric strength. To construct such transistors with high voltage capability, a thick gate oxide and long channel lengths are therefore used in most cases. Furthermore, the transistors M1, M2 must permit high peak currents of up to some amperes so that the feedlines must be correspondingly dimensioned in the layout of a corresponding integrated chip and have relatively large distances from one another. The required drive with voltages of VDD/2 for the gate terminals, so that the corresponding transistor types can be operated efficiently as switches, is also disadvantageous. Accordingly, a driver stage must also be designed in such a manner that signal levels of VDD/2 can be generated. This results in further power dissipation and area requirement.

Corresponding power stages therefore have an increased requirement for area, among other things also because a large width-to-length ratio must be selected in order to achieve a low channel resistance of the transistors M1, M2. This then disadvantageously results in a large gate-source capacitance which is proportional to the gate area and which must be recharged during the switching process. This large capacitance then generates a high power dissipation which is proportional to the switching frequency of the supply voltage and the gate-source capacitance. Such simple class-D power stages are less suitable especially in xDSL applications which are more and more widely used and which operate at switching frequencies around 20 MHz.

In published U.S.-application for patent No. 2004/0027755 A1, it is proposed to connect together a number of controllable paths of transistors to form a cascode arrangement. Although the electrical strength of the overall arrangement will be higher than that of the individual transistors it disadvantageously results in a high area requirement due to the many test code transistors. Furthermore, the channel resistances of the controllable paths add together to form a high resistance value which adversely affects the linearity of a corresponding power stage.

BRIEF SUMMARY OF THE INVENTION

A class D power output stage for switching a supply voltage comprises a limiting transistor, a complementary limiting transistor, a switching transistor and a complementary switching transistor which in each case have a controllable path and a control terminal. The inventive power output stage a level matching device, connected to the supply voltage, for generating control signals in dependence on an input switching signal, wherein the control signals are conducted to the control terminals of the transistors. The controllable paths of the limiting transistors are connected to one another and connected to a first and to a second supply terminal via the controllable paths of the switching transistors, wherein a switched output signal can be picked up between the controllable paths of the limiting transistors. The switching transistors have a lower electrical strength than the limiting transistors.

Standard logic transistors may be used which are protected by limiting transistors so that the entire signal swing, that is to say the supply voltage, is available at the output of the circuit. Using switching transistors with low electrical strength makes it possible to achieve fast switching times as a result of which the power output stage according to the invention is suitable for high bandwidths, that is to say, in particular for being used in xDSL systems. Switching by means of the low-voltage transistors results in low power dissipation of the power output stage according to the invention since switching only takes place over a limited voltage swing. The different electrical strengths also correspond to different channel resistances due to the different transistor types and thus overall provide a low resistance value between the supply terminals. The power output stage according to the invention, therefore, only has a small area with high bandwidth and a particularly low power dissipation. Furthermore, drive arrangements preceding the output stage according to the invention can be constructed to be small and very efficient since the input switching signal for the arrangement according to the invention only requires a small signal swing. Thus, the invention also provides for more cost-effective line driver arrangements overall, e.g. for xDSL applications.

At least one further transistor and one further complementary transistor having in each case a controllable path and a control terminal may be provided, all controllable paths being connected in series to the supply voltage and the level matching device supplying further control signals to the control terminals of the further transistors. Due to the use of further transistors, preferably with low electrical strength control signals can be conducted to the control terminals of the limiting transistors which have a greater difference with respect to the supply voltage potentials. The total resistance between the supply terminals can thus be further reduced and the limiting transistors can be made with smaller dimensions. This further reduces parasitic capacitances and the power dissipation is even lower.

The switching transistors and/or the further transistors may preferably be constructed as low-voltage transistors. The limiting transistors may preferably be constructed as high-voltage transistors with an electrical strength which essentially corresponds to the supply voltage.

The switching transistors and/or the further transistors may be CMOS transistors.

The level matching device may preferably generate the control signals in such a manner that the respective voltages dropped across the controllable paths are lower than the electrical strength of a respective transistor. This thus ensures that shunt currents between the supply terminals cannot damage the transistors used. In this arrangement, constant potentials are then preferably conducted to the control terminals of the limiting transistors.

In one embodiment of the inventive power stage, the respective constant potential is selected in such a manner that it differs from one of the supply voltage potentials by the amount of the sum of the electrical strength of the switching transistors and a threshold voltage of the respective limiting transistor. Due to the choice of this potential arrangement for the control terminals for the limiting transistors, the switching voltages at the switching transistors are in each case so low that none of the switching transistors can be damaged.

The level matching device may preferably generate the control signals conducted to the control terminals of the switching transistors in such a manner that they have in each case a potential which corresponds either to one of the supply voltage potentials or to a supply voltage potential shifted by the electrical strength of the respective switching transistor. The signals supplied to the control terminals or gate terminals of the switching transistors therefore always have either the level of one of the supply voltage potentials or a level shifted in comparison with the supply voltage potential by its electrical strength which, for example, corresponds to a logic level of 2.5 V or less.

The power output stage may preferably be operated with an input switching signal which has a switching frequency of about 10 MHz. The switching transistors may preferably have a lesser oxide thickness than the limiting transistors.

In one embodiment of the inventive power output stage, a first clamping transistor with a controllable path and a control terminal the control terminal being connected to the control terminal of the switching transistor and the controllable path of the clamping transistor being connected to a node between the controllable paths of the switching transistor and the limiting transistor and to a first clamping potential.

Furthermore, a second clamping transistor with a controllable path and a control terminal may be provided, the control terminal being connected to the control terminal of the complementary switching transistor and the controllable path of the clamping transistor being connected to a node between the controllable paths of the complementary switching transistor and of the complementary limiting transistor and to a second clamping potential.

The clamping transistors implement a protective circuit which prevents an excessive voltage from occurring at nodes between the controllable paths of the limiting transistors and the switching transistors. The clamping transistors can have much smaller dimensions than the remaining transistors of the power output stage.

The switching transistors and the clamping transistors coupled to them may be in each case of the complementary type.

The clamping potentials may be set in such a manner that in each case either the controllable path of the corresponding clamping transistor or of the associated switching transistor has a low impedance. The clamping transistors may be constructed as low-voltage transistors.

Developing the power output stage with clamping transistors may prevent the potentials between the limiting transistors and the switching transistors from rising above a critical value. The clamping transistors are driven in such a manner that a corresponding protective circuit is only active, that is to say the load path of the respective clamping transistor has a low impedance, when an excessive voltage can occur at all, that is to say when the controllable paths of the switching transistors are in their low-impedance state. Furthermore, the clamping transistors further reduce the power dissipation of the power output stage since the capacitances of the switching transistor gates are charged to the respective clamping potential when the respective controllable path of the associated switching transistor has a high impedance. The voltage between the gate terminal of the respective switching transistor and the respective clamping potential is only of the order of magnitude of logic levels. The power dissipation generated by the charging-up of the gate capacitances is therefore only low.

DETAILED DESCRIPTION OF THE INVENTION

Unless otherwise specified, identical or functionally identical elements in the figures have been provided with the same reference symbols.

Figure 1:
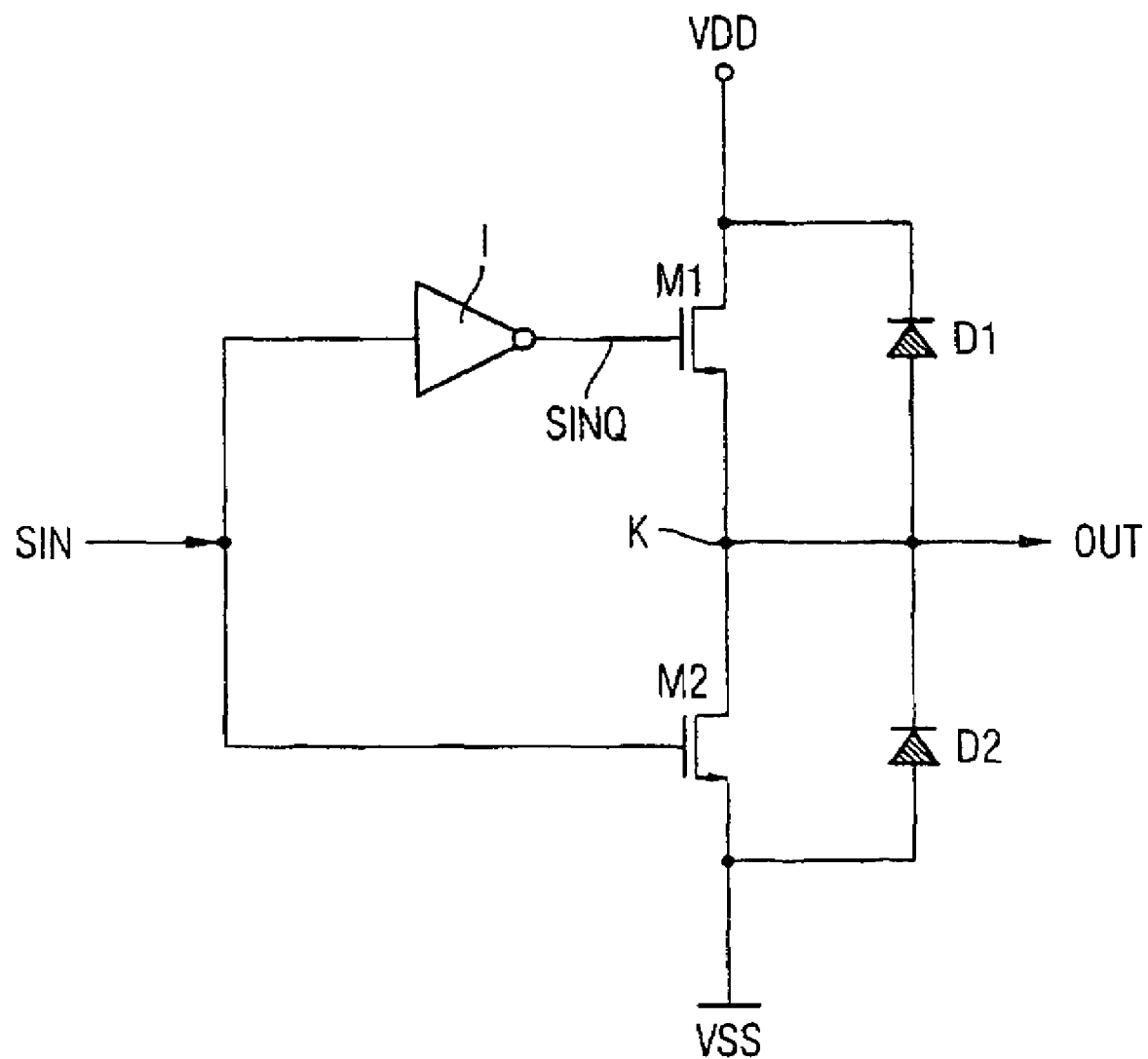
FIG. 1, as discussed above, is an conventional a class-D output stage.
Figure 2:
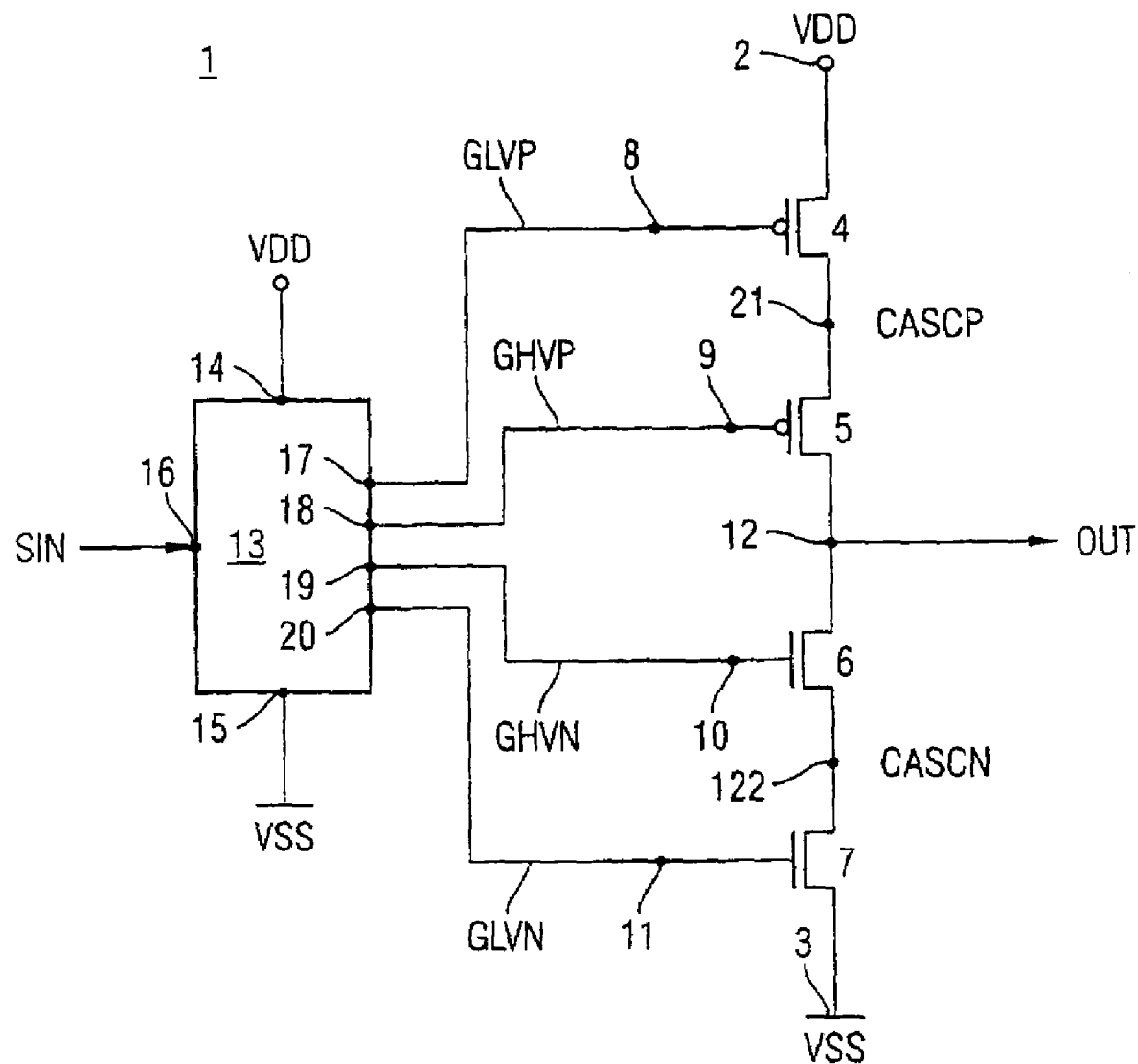
FIG. 2 is an exemplary embodiment of an inventive class-D power output stage.

FIG. 2 shows a circuit arrangement according to the invention for forming a class-D power output stage 1. For this purpose, a first supply terminal 2 at a first supply voltage potential VDD and a second supply terminal 3 at a second supply voltage potential VSS are provided. Between the supply terminals 2, 3, the controllable paths or load paths of four transistors 4, 5, 6, 7 are connected in series. The transistors are constructed as MOS transistors and in each case have a control or gate terminal 8, 9, 10, 11. The transistors 5, 6 are constructed as high-voltage transistors which have an electrical strength of, for example, 15-25 V and thus withstand a supply voltage VDD–VSS. Electrical strength is preferably selected to be about 22 V. Between the controllable paths of these mutually complementary transistors 5, 6, a node 12 is provided at which an output signal OUT of the power stage 1 according to the invention can be picked up.

The two MOS transistors 4, 7, via which the high-voltage transistors 5, 6 used as limiting transistors are connected to the respective supply terminal 2, 3, are preferably constructed as low-voltage logic transistors. By means of these low-voltage logic transistors 4, 7, either the higher supply voltage potential VDD or the lower supply voltage potential VSS is switched to the node 12 via the controllable path of one of the limiting transistors 5, 6. The low-voltage transistors 4, 7 are, therefore, used as switching transistors.

A control signal GLVP, GHVP, GHVN, GLVN generated by a level matching device 13 are in each case connected to the gate terminals 8, 9, 10, 11 of the MOS transistors used here. The level matching device is connected to the supply voltage VDD–VSS via supply terminals 14, 15 and has a signal input 16. An input switching signal SIN is coupled to the signal input 16. Furthermore, the level matching device 13 has four control outputs 17, 18, 19, 20 at which in each case one of the control signals GLVP, GHVP, GHVN, GLVN can be picked up for the gate terminals 8, 9, 10, 11 of the transistors 4, 5, 6, 7.

Here, the first switching transistor 4 is constructed as PMOS logic transistor and the second switching transistor 7 is constructed as NMOS logic transistor. The first limiting transistor 5 is constructed as high-voltage PMOS transistor and the second limiting transistor 6 is constructed as high-voltage NMOS transistor. The switching transistors 4, 7 in each case have an electrical strength for usual logic switching levels of about 2.5 V. Due to the cascoded interconnection of the load paths of the transistors 4, 5, 6, 7, the standard logic transistors 4, 7 are protected by the high-voltage transistors 5, 6.

The level matching device 13 in each case supplies to the gate terminals 9, 10 of the limiting transistors 5, 6 a control signal GHVP, GHVN at a constant potential. The control signal GHVP conducted to the gate terminal 9 of the PMOS limiting transistor 5 has a potential of GHVP=VDD−VLV−VTH, where VDD is the first supply voltage potential, VLV the electrical strength of the switching transistors 4, 7 and VTH is the threshold voltage of the limiting transistors 5, 6. The level matching device 13 supplies at its output 19 a control signal GHVN having a constant potential GHVN=VSS+VLV+VTH to the gate terminal 10 of the second NMOS limiting transistor 6.

The gate terminals 8, 11 of the switching transistors 4, 7 are in each case driven by a control or switching signal GLVP, GLVN which has a signal swing of maximum electrical strength or, respectively, of the maximum drain-source voltage for the switching transistors 4, 7. The input switching signal SIN essentially has such a logic signal swing of 2.5 V or less. As a rule, the input switching signal has a first or second logic level or H (high) or L (low), by means of which the switching transistors 4, 7 are driven. According to the invention, the level matching device 13 shifts the input switching signal SIN in such a manner that a first logical H level of the input switching signal SIN at the first switching transistor 4 or its gate terminal 8, respectively, corresponds to the first supply voltage potential VDD, and the second logical level L corresponds to a potential VDD−VLV. Analogously, the second NMOS switching transistor 7 or its gate 11, respectively, is supplied with a switching or control signal GLVN which is either at the second supply voltage potential VSS corresponding to the logical L level, or VSS+VLV corresponding to the logical H level. The two switching signals GLVP, GLVN are complementary with respect to the logic levels represented by them. For this reason, only one of the two switching transistors 4, 7 will ever conduct.

The breakdown voltages or electrical strengths or maximum drain-source voltages of the transistors 4, 5, 6, 7 are essentially determined by the oxide thickness of the respective gate area. According to the invention, the gate oxide thicknesses are selected in such a manner that a corresponding electrical strength of the transistors is achieved. The logic switching transistors 4, 7 preferably have a thin gate oxide where as the limiting transistors 5, 6 have a thicker gate oxide layer.

The drive or choice of control signals GHVP, GHVN according to the invention ensures that no voltage which is higher than the respective electrical strength is dropped across any of the switching transistors 4, 7. Between the first supply terminal 2 and a node 21 between the first PMOS switching transistor 4 and the first PMOS limiting transistor 5, a voltage VDD−CASCP is dropped which is preferably less than 2.5 V in this case.

Similarly, a voltage CASCN−VSS which is less than 2.5 V is dropped across a node 122 between the controllable path of the NMOS limiting transistor 6 and the NMOS switching transistor 7.

The level matching device 13 preferably generates the switching signals GLVP, GLVN in such a manner that, in order to prevent shunt currents between the supply voltage terminals 2, 3, a dead time of about 1 ns is provided in which both controllable paths of the switching transistors 4, 7 remain in a high-impedance state.

A particular advantage of the circuit according to the invention consists in that the standard logic transistors used as switching transistors 4, 7 have a particularly high transit frequency and the switching swing is limited to the normal supply voltage of these low-voltage transistors 4, 7. As a result, a low power dissipation of the class D power output stage according to the invention is achieved which is proportional to the switching frequency of parasitic capacitances and to the square of the switching signal swing. The construction according to the invention of the series-connected controllable paths of the switching and limiting transistors 4, 5, 6, 7 also leads to a particularly low resistance between the supply terminals 2, 3.

Figure 3:
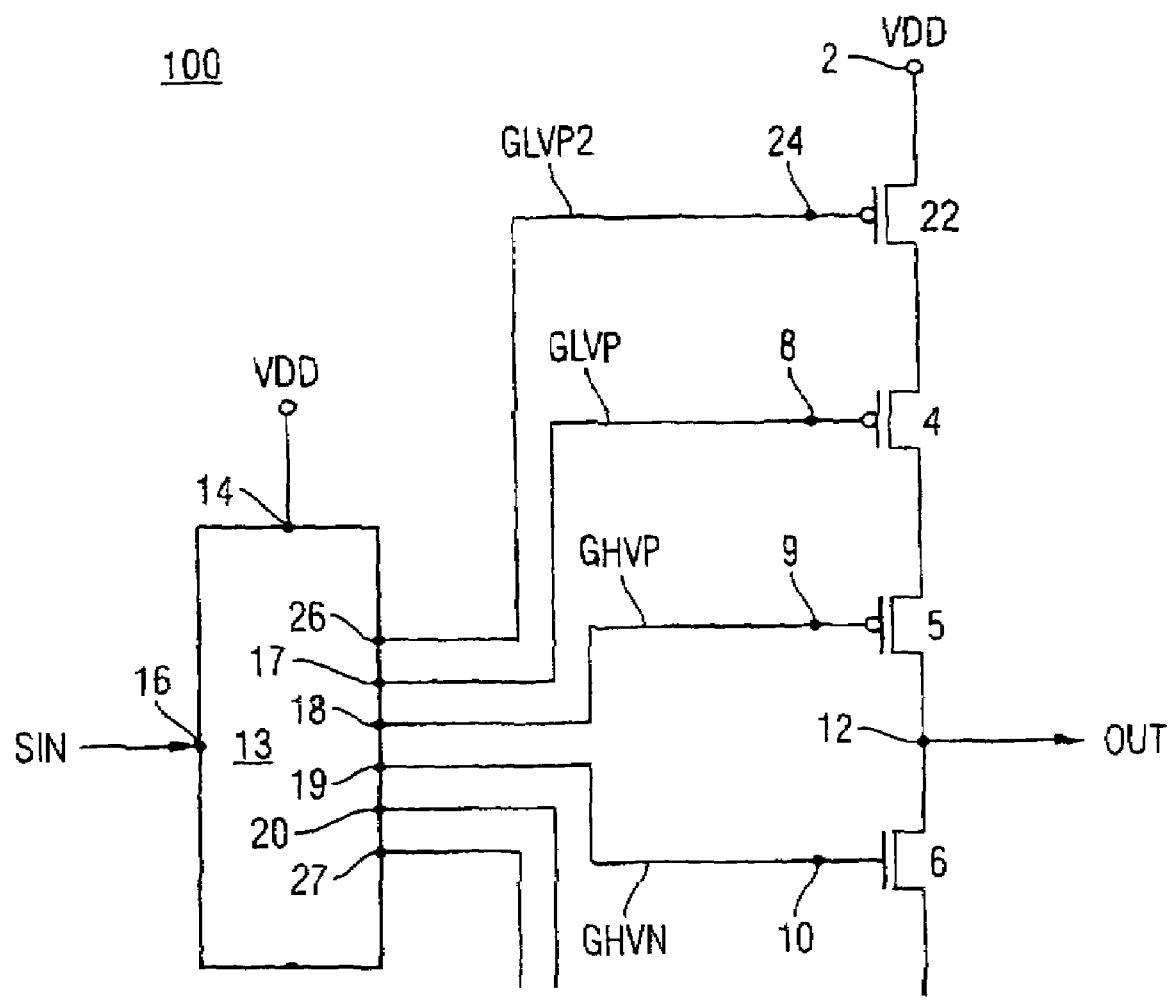
FIG. 3 is another exemplary embodiment of an inventive power output stage

FIG. 3 shows a first development of the class-D power output stage 100 according to the invention. The embodiment according to FIG. 3 essentially has the same elements as in FIG. 2 but a further PMOS transistor 22 and a further NMOS transistor 23 are provided which are also constructed as low-voltage transistors or standard logic transistors. The controllable path of the switching transistor 4 is thus connected to the supply terminal 2 via the controllable path of the further PMOS transistor 22 and the controllable path of the second switching transistor 7, which is constructed as NMOS transistor, is coupled to the second supply terminal 3 via the controllable path of the second further NMOS transistor 23.

A control signal GLVP2, GLVN2 which can be picked up at the control outputs 26, 27 of the level matching device 13 is in each case conducted to the control or gate terminals 24, 25 of the further transistors 22, 23. In the development 100 shown here, the further transistors 22, 23 are used as switching transistors and the control signal GLVP2 has either the potential VDD (H level) or VDD−VLV (low level). The control signal GLVN2 has either a potential VSS+VLV (H level) or VSS (L level). The control signal GSVN is then placed at GLVN=VSS+VLV+VTH2, VTH2 being the threshold voltage of the NMOS transistors 4, 7. The control signal GHVN is placed at GHVN=VSS+2VLV+VTH. Analogously, the control signal GLVP has a potential GLVN=VDD−VLV−VTH2, and the control signal GHVP is offset at GHVP=VDD−2VLV−VTH.

In the development 100 according to FIG. 3, the gates 9, 10 of the high-voltage transistors 5, 6 can be operated at a higher voltage with respect to VSS or VDD, respectively. This further reduces the impedance between the supply terminals 2, 3 and high-voltage transistors 5, 6 of smaller dimensions can be used. The development 100 therefore has an improved power dissipation and fewer parasitic capacitances.

Figure 4:
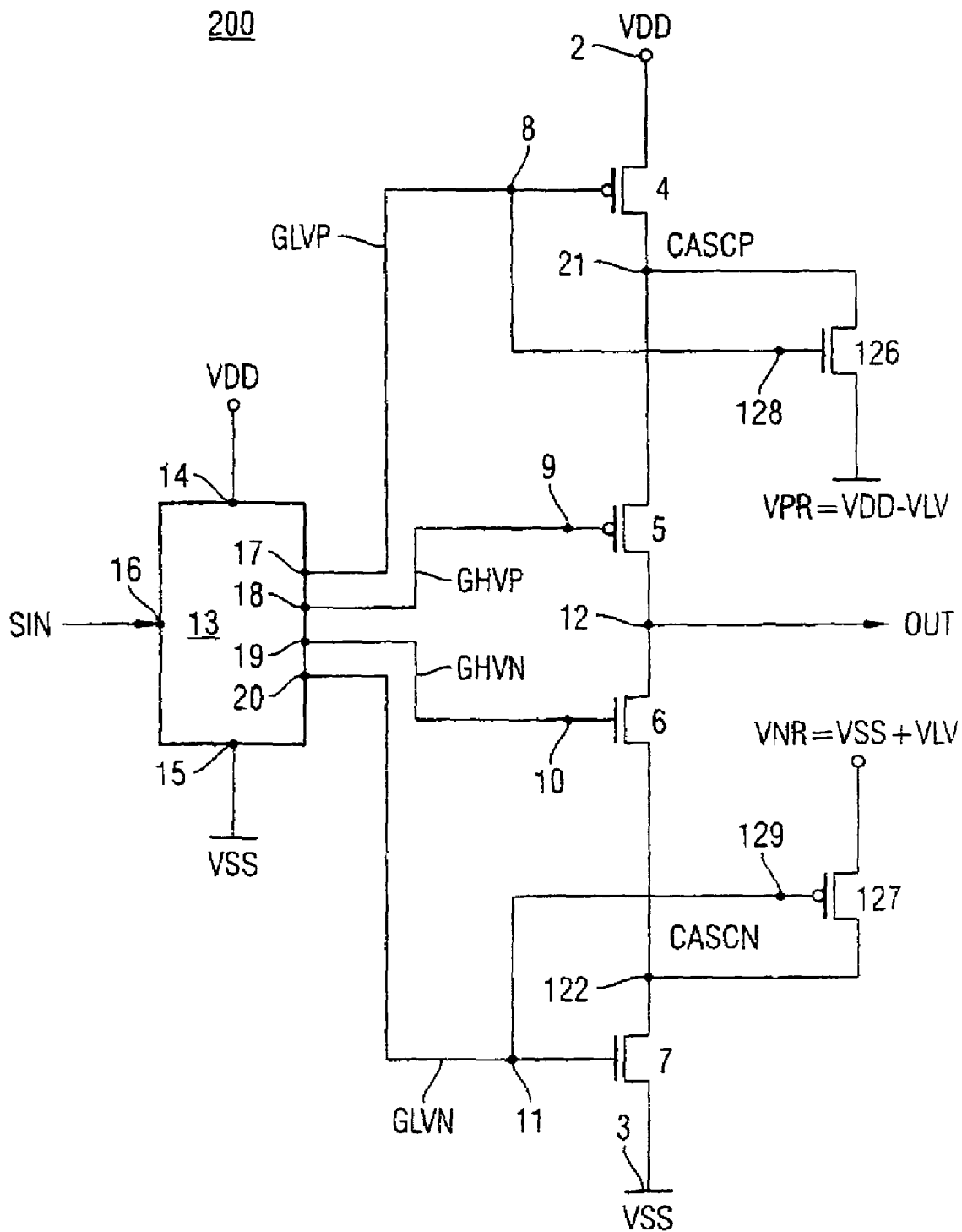
FIG. 4 is a further exemplary embodiment of an inventive power output stage.

FIG. 4 shows a second development 200 of the class-D power output stage according to the invention. The power output stage 200 essentially has the same elements as shown in FIG. 2. Furthermore, a first clamping transistor 126 is provided as NMOS transistor, the controllable path of which is connected between the node 21 and a clamping potential VPR and gate terminal 128 of which is coupled to the gate terminal 8 of the PMOS switching transistor 4. Furthermore, a second clamping transistor 27 constructed as PMOS transistor is provided, the controllable path of which is connected between the node 22 and a second clamping potential VNR, the gate terminal 129 of the second clamping transistor 127 being coupled to the gate terminal 11 of the second switching transistor 7 constructed as NMOS transistor.

The first clamping potential VPR is VPR=VDD−VLV and the second clamping potential is set to VNR=VSS−VSV. The protective circuit implemented by the clamping transistors 126, 127 eliminates any excessive voltage at the nodes 21, 122. If the controllable paths of the switching transistors 4, 7 are in the high-impedance state, the nodes 21, 122 also have a high impedance. The potential of the first node 21 is then CASCP=GHVN−VTH and at node 122 it is CASCP=GHVP−VTH. The voltage between the supply terminal 2 and the node 21 VDD−CASCP and between the second supply terminal 3 and the node 22 CASCN−VSS can thus be reduced by the control signals GHVP, GHVN. However, this results in an increase in impedance of the controllable paths of the limiting transistors 5, 6 which is undesirable.

The potentials CASCP and CASCN at the nodes 21 and 22, respectively, are also influenced by the leakage current of transistors 4, 5, 6, 7. If the controllable path of transistor 7 has a high impedance, for example in static operation, the potential CASCN initially rises until the leakage current through the controllable path of transistor 6 and the controllable path of transistor 7 are identical. The potential CASCN can then rise undesirably up to GHVN. In dynamic operation when, for example, transistor 7 is switched at a high switching rate, peak voltages also occur at the switching times which decay to the static value after a time constant which depends on the channel impedance of the transistor capacitance and the feedline capacitances.

The clamping transistors 126, 127 interconnected according to the invention prevent these excessive voltages. The protective circuits formed by the clamping transistors 126, 127 are activated when the switching transistors 4, 7 are in the high-impedance state. To protect the PMOS switching transistor 4, an NMOS clamping transistor 126 is used which has a low-impedance load path when the controllable path of the PMOS switching transistor 4 has a high impedance. The clamping potential VPR=VDD−VLV is selected in such a way that it is lower or equal to the electrical strength of the low-voltage transistor 4 compared with VDD. Analogously, a PMOS clamping transistor 127 is provided for the NMOS switching transistor 7, which also has a low-impedance controllable path when the controllable path of the associated switching transistor 7 is driven with a high impedance.

The clamping transistors 126, 127 can be dimensioned to be particularly small so that the additional expenditure of area is virtually negligible compared with the construction of the transistors 4, 5, 6, 7. Due to the protective circuit, for example the NMOS clamping transistor 126, the power dissipation of the power output stage 200 according to the invention does not increase because, if the node 21 reaches a potential CASCP so that VDD−CASCP is of the order of magnitude of the electrical strength of the low-voltage transistor 4, the excessive current will be removed by the clamping transistor 126. This current can be used, for example, by a load which is designed for a low-voltage supply of about 2.5 V. No additional current is therefore taken from the supply terminal 2. Analogously, no additional current flows out of the second supply terminal 3 into the circuit when the second clamping transistor 27 is at low impedance if the voltage CASCN−VSS at the node 22 becomes undesirably high. An excessive voltage of the low-voltage transistors is, therefore, reliably prevented by means of minimum additional circuit expenditure compared with the basic circuit of the class D power output stage according to the invention. Compared with the transistors 4, 5, 6, 7, the area needed is negligible and no additional auxiliary voltages are needed. Using the clamping transistors thus also prolongs the life of the transistors.

Due to the clamping transistor 127, operating inversely with respect to the switching transistor 7, a voltage of VLV is present between the gate terminal 11 of the switching transistor 7 and the node 122 if the switching transistor 7 has a high impedance. For example, with a charging current of 1 mA for the gate capacitance, a power dissipation of 2.5 mW is obtained at VLV=2.5 V due to the charging of the capacitance. Without the clamping transistor, the corresponding charging current would have to be taken from the supply voltage VDD—VSS. With a supply voltage of VDD−VSS of 15 V, this would result in a power dissipation of 15 mW. An analogous situation is obtained for the clamping transistor 126. Using the clamping transistors 126, 127 thus further improves the power efficiency of the power output stage according to the invention.

Although the present invention has been explained with reference to preferred illustrative embodiments, it is not restricted to these, rather it can be modified in many ways. In particular, supply voltages and electrical strengths which deviate from the illustrative embodiments can be used.

Although modifications and changes may be suggested by those skilled in the art, it is the intention of the inventors to embody within the patent warranted hereon all changes and modifications as reasonably and properly come within the scope of their contribution to the art.

What is claimed is:

1. A class D power output stage for switching a supply voltage, comprising:
    a limiting transistor comprising a controllable path and a control terminal;
    a complementary limiting transistor comprising a controllable path and a control terminal, wherein a switched output signal between said controllable paths of said limiting and complementary limiting transistors can be taped off;
    a switching transistor comprising a controllable path and a control terminal;
    a complementary switching transistor comprising a controllable path and a control terminal; said controllable paths of said limiting and said complementary limiting transistors being connected together and connected to a first and a second supply terminal via said controllable paths of said switching and complementary switching transistors and said switching and said complementary switching transistors having a lower electrical strength than said limiting and complementary limiting transistors; and
    a level matching device for generating control signals in response to an input switching signal; said matching device being connected to said supply voltage and said control signals being fed to said control terminals.

2. The output stage of claim 1, further comprising:
    at least one further transistor comprising a controllable path and a control terminal; and at least one further complementary transistor comprising a controllable path and a control terminal; wherein each of said controllable paths are connected in series to said supply voltage and said level matching device supplies further control signals to said control terminals of said further transistors and further complementary transistors.

3. The output stage of claim 2, wherein said further transistor and said further complementary transistor are low voltage transistors, CMOS transistors, or low voltage CMOS transistors.

4. The output stage of claim 1, wherein said switching and complementary switching transistors are low voltage transistors, CMOS transistors, or low voltage CMOS transistors.

5. The output stage of claim 1, wherein said limiting and complementary limiting transistors are high-voltage transistors with an electrical strength which essentially corresponds to said supply voltage.

6. The output stage of claim 1, wherein said input switching signal has a logic level and said output signal has a signal swing essentially corresponding to said supply voltage.

7. The output stage of claim 1, wherein said level matching device generates said control signals in such a manner that the respective voltages across said controllable paths are lower than the electrical strength of the respective of said transistors.

8. The output stage of claim 7, wherein the control signals fed to said control terminals of said limiting and complementary limiting transistors have each a constant potential.

9. The output stage of claim 8, wherein said constant potential related to said limiting transistor is selected in such a manner that it differs from the potential of said supply voltage by an amount equaling the sum of said electrical strength of said switching transistor and a threshold voltage of said limiting transistor, and wherein said constant potential related to said complementary limiting transistor is selected in such a manner that it differs from the potential of said supply voltage by an amount equaling the sum of said electrical strength of said complementary switching transistor and a threshold voltage of said complementary limiting transistor.

10. The output stage of claim 1, wherein said level matching device generates said control signals fed to said control terminals of said switching and complementary switching transistors in such a manner that said control signals have either a potential which corresponds to the potential of said supply voltage or a potential which corresponds to the potential of said supply voltage shifted by the electrical strength of the respective of said switching or complementary switching transistors.

11. The output stage of claim 1, wherein said input switching signal comprises a first or second logic level and said level matching device generates said control signals by shifting said input switching signal in such a manner that said first and second logic levels are associated with respective of the potentials of said first and a second supply terminals, and wherein a signal swing of the respective of said control signals corresponds to a signal swing of said input switching signal.

12. The output stage of claim 1, wherein said input switching signal has a switching frequency of about 10 MHz.

13. The output stage of claim 1, wherein said switching and complementary switching transistors have a lesser oxide thickness than said limiting and complementary limiting transistors.

14. The output stage of claim 1, comprising a first clamping transistor which comprises a controllable path and a control terminal connected to said control terminal of said switching transistor; said controllable path of said clamping transistor being connected to a first node between said controllable paths of said switching transistor and of said limiting transistor and to a first clamping potential.

15. The output stage of claim 14, comprising a second clamping transistor which comprises a controllable path and a control terminal connected to said control terminal of said complementary switching transistor; said controllable path of said second clamping transistor being connected to a second node between said controllable paths of said complementary switching transistor and said complementary limiting transistor and to a second clamping potential.

16. The output stage of claim 15, wherein said switching and complementary switching transistors and said first and second clamping transistors coupled thereto are in each case of complementary type.

17. The output stage of claim 15, wherein said first and second clamping potentials are set in such a manner that in each case either said controllable path of said respective first or second clamping transistor or of the relevant of said switching or complementary switching transistor has a low impedance.

18. The output stage of claim 15, wherein said first and second clamping transistors are constructed as low-voltage transistors.

* * * * *

UNITED STATES PATENT AND TRADEMARK OFFICE
CERTIFICATE OF CORRECTION

PATENT NO.          : 7,342,448 B2
APPLICATION NO.     : 11/477576
DATED               : March 11, 2008
INVENTOR(S)         : Muhlbacher et al.

It is certified that error appears in the above-identified patent and that said Letters Patent is hereby corrected as shown below:

On title page, item 75 - Please correct the spelling of "Joachim Gratz" to read "Achim Gratz" and correct the spelling of "Evelyne Kricki" to read "Evelyne Krickl" as follows:

--(75)  Inventors:    Benno Mülbacher, Bad St. Leonhard (AT); Achim Gratz, Dresden (DE); Evelyne Krickl, Villach (AT); Thomas Pötscher, Dresden (DE); Mayk Roehrich, Dresden (DE); David San Segundo Bello, Villach (AT); Andreas Wiesbauer, Pörtschach (AT)--

Signed and Sealed this

Second Day of December, 2008

JON W. DUDAS
*Director of the United States Patent and Trademark Office*